US007749918B2

(12) United States Patent
Oosterlaken et al.

(10) Patent No.: US 7,749,918 B2
(45) Date of Patent: *Jul. 6, 2010

(54) METHOD AND APPARATUS FOR PROCESSING SEMICONDUCTOR SUBSTRATES

(75) Inventors: Theodorus G. M. Oosterlaken, Oudewater (NL); Frank Huussen, Bilthoven (NL)

(73) Assignee: ASM International N.V. (NL)

( * ) Notice: Subject to any disclaimer, the term of this patent is extended or adjusted under 35 U.S.C. 154(b) by 342 days.

This patent is subject to a terminal disclaimer.

(21) Appl. No.: 11/843,530

(22) Filed: Aug. 22, 2007

(65) Prior Publication Data

US 2008/0008975 A1   Jan. 10, 2008

Related U.S. Application Data

(63) Continuation of application No. 11/049,048, filed on Feb. 1, 2005, now Pat. No. 7,273,819.

(60) Provisional application No. 60/541,357, filed on Feb. 2, 2004.

(51) Int. Cl.
  *H01L 21/31* (2006.01)
  *H01L 21/469* (2006.01)
(52) U.S. Cl. ..................................... 438/770
(58) Field of Classification Search .............. 118/724; 257/E21.284; 438/770, 773
  See application file for complete search history.

(56) References Cited

U.S. PATENT DOCUMENTS

| 5,207,573 | A | 5/1993 | Miyagi et al. |
| 5,330,352 | A | 7/1994 | Watanabe et al. |
| 5,567,149 | A | 10/1996 | Hansotte et al. |
| 5,662,470 | A | 9/1997 | Huussen et al. |
| 6,164,963 | A | 12/2000 | Weaver |
| 6,235,121 | B1 | 5/2001 | Honma et al. |
| 6,316,371 | B1 | 11/2001 | Oosterlaken et al. |
| 6,383,927 | B2 | 5/2002 | Usami |
| 6,499,768 | B2 | 12/2002 | De Ridder |
| 6,503,079 | B2 | 1/2003 | Kogano et al. |
| 6,709,525 | B2 | 3/2004 | Song |
| 6,746,240 | B2 | 6/2004 | De Ridder et al. |
| 7,067,439 | B2 | 6/2006 | Metzner et al. |
| 7,273,819 | B2 * | 9/2007 | Oosterlaken et al. ........ 438/770 |
| 2004/0058560 | A1 | 3/2004 | Ranish et al. |
| 2005/0016956 | A1 | 1/2005 | Liu et al. |

FOREIGN PATENT DOCUMENTS

JP   2003-338623   11/2003

* cited by examiner

*Primary Examiner*—Asok K Sarkar
(74) *Attorney, Agent, or Firm*—Knobbe, Martens, Olson & Bear LLP

(57) ABSTRACT

Substrates in a reaction chamber are sequentially exposed to at least three gas atmospheres: a first atmosphere of a first purge gas, a second atmosphere of a process gas and a third atmosphere of a second purge gas. The gases are introduced into the reaction chamber from one end of the chamber and exit from the opposite end. Successive gases entering the chamber are selected so that a stable interface with the immediately preceding gas can be maintained. For example, when the gases are fed into the chamber at the chamber's top end and are exhausted at the bottom end, the gases are chosen with successively lower molecular weights. In effect, each gas atmosphere stays on top of and pushes the previous gas atmosphere out of the chamber from the top down. Advantageously, the gases can be more effectively and completely removed from the chamber.

25 Claims, 3 Drawing Sheets

| Sequence | First purge gas | Process gas | Second purge gas |
|---|---|---|---|
| 1.1 | Ar | $O_2$ | $N_2$ |
| 1.2 | 50% Ar / 50% $N_2$ | $O_2$ | $N_2$ |
| 1.3 | Ar | $O_2$ | He |
| | | | |
| 1.4 | $N_2$ | $H_2O$ | He |
| 1.5 | $N_2$ | $H_2O$ | Ne |
| 1.6 | $N_2$ | 50% $H_2O$ / 50% $O_2$ | He |

Figure 2

| Sequence | First purge gas | Process gas | Second purge gas |
|---|---|---|---|
| 2.1 | $N_2$ | $O_2$ | Ar |
| 2.2 | $N_2$ | $O_2$ | 50% Ar / 50% $N_2$ |
| 2.3 | $N_2$ | $O_2$ | $CO_2$ |
| | | | |
| 2.4 | He | $H_2O$ | $N_2$ |
| 2.5 | Ne | $H_2O$ | $N_2$ |
| 2.6 | He | 50% $H_2O$ / 50% $O_2$ | $N_2$ |

Figure 3

| Gas | Molecular or atomic weight |
|---|---|
| H₂ | 2 |
| He | 4 |
| CH₄ | 16 |
| NH₃ | 17 |
| H₂O | 18 |
| Ne | 20 |
| 50% H₂O / 50% O₂ | 25 |
| 28.6 % H₂O in O₂ | 28 |
| N₂ | 28 |
| O₂ | 32 |
| 33 1/3 % Ar in N₂ | 32 |
| 50% Ar / 50% N₂ | 34 |
| Ar | 40 |
| N₂O | 44 |
| CO₂ | 44 |
| CCl₄ | 154 |

METHOD AND APPARATUS FOR PROCESSING SEMICONDUCTOR SUBSTRATES

REFERENCE TO RELATED APPLICATION

This application is a continuation of U.S. patent application Ser. No. 11/049,048, filed Feb. 1, 2005, which claims the priority benefit under 35 U.S.C. §119(e) of provisional Application No. 60/541,357, filed Feb. 2, 2004.

This application is also related to U.S. Provisional Application No. 60/538,351, entitled METHOD FOR PURGING SEALS IN A THERMAL REACTOR, filed Jan. 21, 2004, the entire disclosure of which is incorporated herein by reference. This application is also related to U.S. patent application Ser. No. 11/038,357, entitled METHOD AND APPARATUS FOR PURGING SEALS IN A THERMAL REACTOR, filed Jan. 18, 2004 (issued as U.S. Pat. No. 7,128,570).

BACKGROUND OF THE INVENTION

1. Field of the Invention

This invention relates generally to the field of semiconductor processing and, more particularly, to thermal reactors used for thermal processing.

2. Description of the Related Art

Semiconductor processing in a thermal reactor typically occurs in the reaction chamber of the thermal reactor, where semiconductor substrates loaded inside the reaction chamber are typically exposed to process gases, which typically chemically react with the substrates. For example, in thermal oxidation processes, the substrates are typically exposed to process gases such as $O_2$ gas or to water vapor or to a mixture of $O_2$ and water vapor to oxidize the substrates.

Before and after the exposure of the substrates to the process gas(es), the reaction chamber is generally purged with an inactive purging gas which does not react with the substrate. This purging is typically performed to avoid any undesirable reactions before and after the processing step, during which reactive process gases are flowed into the chamber. A purge typically removes any reactants from the chamber before the processing step and also removes the process gases and any byproduct from the reaction chamber after the processing step. Thus, by purging and flowing process gases into a chamber, the gas atmosphere in the process chamber can be changed several times during a process cycle.

It has been observed that this change of atmosphere can introduce undesirable transition effects, as described in U.S. Pat. No. 6,316,371, METHOD FOR THE CHEMICAL TREATMENT OF A SEMICONDUCTOR SUBSTRATE, issued Nov. 13, 2001 and assigned to ASM International, N.V., the entire disclosure of which is incorporated herein by reference. That patent describes a vertical thermal oxidation furnace which operates at substantially atmospheric pressure. In such a furnace the gas is typically introduced at the top of the furnace and is exhausted at the bottom, causing gas inside the reaction chamber to flow in a generally downward direction.

While the process results across a wafer and between individual wafers are preferably uniform, it has been observed that transitioning from one gas to another in a reaction chamber can detrimentally affect the uniformity of process results.

Accordingly, there is a need for methods for effectively removing gases and changing atmospheres in a reaction chamber, while minimizing the impact of atmosphere changes on process results.

SUMMARY OF THE INVENTION

According to one aspect of the invention, a method is provided for semiconductor processing. The method comprises providing a reaction chamber in a vertical furnace. Gas is flowed into the reaction chamber proximate one vertical end of the chamber and is exhausted out of the chamber proximate an other vertical end of the chamber. Flowing and exhausting the gas changes an atmosphere inside the furnace at least from a first atmosphere comprising a first gas to a second atmosphere comprising a second gas and then to a third atmosphere comprising a third gas. A weighted average molecular weight of one of the first, the second and the third gases is determined and the others of the first, the second and the third gases are selected based upon that weighted average molecular weight. Gases constituting the second and third atmospheres have about equal, or higher weighted average molecular weights, compared to the first and second atmospheres, respectively, when the gases are flowed into the reaction chamber proximate a bottom end of the chamber. On the other hand, gases constituting the second and third atmospheres have about equal, or lower weighted average molecular weights, compared to the first and second atmospheres, respectively, when the gases are flowed into the reaction chamber proximate a top end of the chamber.

According to yet another aspect of the invention, a method is provided for semiconductor processing. The method comprises providing a semiconductor substrate in a vertically extending reaction chamber. The semiconductor substrate is sequentially exposed to each of three or more gases, each having a molecular weight. The gases have an about equal or an increasingly higher or lower molecular weight as sequentially exposing progresses.

According to another aspect of the invention, a method is provided for semiconductor processing. The method comprises providing a substrate in a reaction chamber. A first purge gas is flowed into the chamber. The first purge gas in the chamber is substantially replaced with a process gas. The process gas in the chamber is substantially replaced with a second purge gas. The first and the second purge gases are different.

According to yet another aspect of the invention, a system is provided for semiconductor processing. The system comprises a vertically extending reaction chamber having connections to at least three gases. The reaction chamber has a gas entrance proximate one vertical end of the reaction chamber and a gas exhaust for exhausting gases out of the reaction chamber at the other vertical end of the reaction chamber. The system also comprises a gas flow controller configured to separately introduce gas from each of the at least three gas sources into the chamber. The introduced gases have sequentially increasingly higher densities or weighted average molecular weights when the gas entrance is proximate a bottom end of the reaction chamber and have sequentially increasingly lower densities or weighted average molecular weights when the gas entrance is proximate a top end of the reaction chamber.

According to another aspect of the invention, a method is provided for providing gas to a reaction chamber of a semiconductor reactor. The method comprises flowing a first gas into the reaction chamber. A second gas is also flowed into the chamber. Flowing the second gas comprises introducing the second gas and the first gas into the chamber simultaneously. Introducing the second and the first gases comprises selecting relative quantities of the second gas and the first gas introduced into the chamber based upon a weighted average molecular weight of gas flowing into the chamber so that the weighted average molecular weight of the second gas and the first gas entering the chamber varies by a set variation amount per unit of time. Flowing the second gas also comprises progressively decreasing the quantity of the first gas introduced into the chamber and flowing only the second gas into the chamber after progressively decreasing the quantity of the first gas.

BRIEF DESCRIPTION OF THE DRAWINGS

The invention will be better understood from the detailed description of the preferred embodiments and from the appended drawings, which are meant to illustrate and not to limit the invention, and wherein:

FIG. 2 is a table illustrating exemplary sequences of gases for reaction chambers where gas exits the chamber by moving in a downward direction, in accordance with preferred embodiments of the invention;

FIG. 3 is a table illustrating exemplary sequences of gases for reaction chambers where gas exits the chamber by moving in an upward direction, in accordance with preferred embodiments of the invention; and FIG. 4 is a table listing the molecular or atomic weights of exemplary gases for use in accordance with preferred embodiments of the invention.

DETAILED DESCRIPTION OF THE PREFERRED EMBODIMENT

Figure 1:
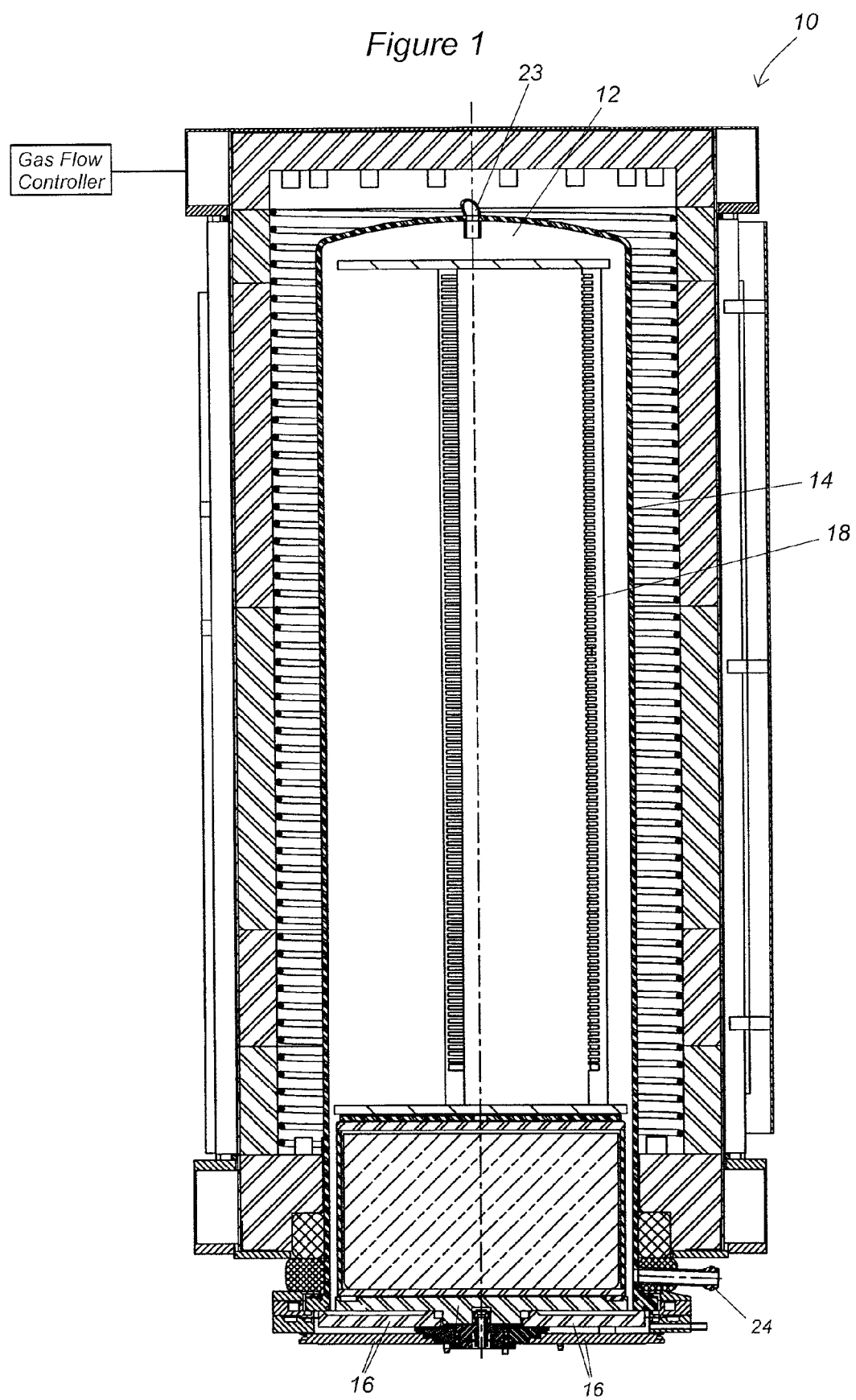
FIG. 1 is a cross-sectional side view of an exemplary furnace for use with preferred embodiments of the invention.

It has been found that non-uniform process results observed in processes that require changing reaction chamber atmospheres can be due to gravitational or buoyancy induced effects. For example, differences in the molecular weights or densities of the gases constituting the atmospheres can cause unwanted gravitation- or buoyancy-induced gas flow patterns to arise or the relative molecular weights of some gases can cause those gases to undesirably persist in some parts of the reaction chamber, even after an atmosphere "change." These effects make it difficult to change the gas atmosphere in the chamber in a controlled way.

For example, when the reaction chamber is filled with $N_2$, having a molecular weight of 28, and then $O_2$, having a molecular weight of 32, is introduced from the top of the reaction chamber, the $O_2$ has a tendency to "sink" through the lighter $N_2$; by "lighter" it is meant that the $N_2$ has a lower molecular weight than the $O_2$. As a result, the $O_2$ tends to travel to the bottom of the reaction chamber. Because of this tendency, it is difficult to replace $N_2$ present in the top region of the chamber with $O_2$. Consequently, $N_2$ residing in the reaction chamber can remain present near the top of the reaction chamber even after introduction of $O_2$ and possibly for a longer time afterwards. In addition, a gravitation- or buoyancy-induced gas flow pattern might establish itself, especially at or near atmospheric pressure, resulting in strong reactant gas concentration gradients in the reaction chamber. As a result of these phenomena, process and/or purge gases can be present in some parts of the chamber when their presence is not desired. This can cause unwanted reactions or dilution of process gases, thereby causing the uniformity of process results to be detrimentally affected.

These phenomena can frequently occur in reactors where the gas feed into the reaction chamber is at the top end of the reaction chamber and the gas exhaust is at the bottom end of the chamber. Gases can undesirably persist at the ends of such reactors, or gravitation- or buoyancy-induced gas flow patterns can be established along the vertical axis of the chamber. These flow patterns can skew process results by causing unwanted reactions or altering process gas concentrations along the path of the flows for prolonged periods of time.

Advantageously, it has been found that these phenomena can be minimized and the atmosphere within a reaction chamber can be efficiently changed by the appropriate selection and ordering of gases for introduction into the chamber, as discussed below. Preferably, the gases entering the chamber are selected based upon molecular weight, to minimize undesirable movement of each of a succession of different gases. For example, in some preferred embodiments in which gases travel downwards to exit the chamber, at least some of the gases successively entering the chamber in a given process cycle have successively lower molecular weights, so that they can remain above gases already in the chamber and push those gases down and out of the chamber. Where the gases travel upward to exit a chamber, the reverse arrangement can be used to push earlier gases upward to the exit; that is, at least some of the gases successively entering the chamber in a given process cycle have successively greater molecular weights. In other preferred embodiments, the various purge and process gases entering a chamber can be mixed before entering the chamber, or at least some of the gases successively entering the chamber in a given process cycle can be selected with molecular weights which are close to the molecular weight of the previous gas. While the invention is not limited by theory, by mixing or appropriately choosing the molecular weight of the various gases, it is believed that a stable interface between the various layers can be maintained and the unwanted persistence or movement of gases can be minimized.

Reference will now be made to the Figures.

It will be appreciated that while the invention has application to various reactors known in the art, it is particularly advantageous when applied to reactors with vertical gas flow patterns, such as vertical furnaces. Exemplary reactors are available commercially under the trade names A410™ and A412™ from ASM International, N.V. of The Netherlands. Such a reactor 10 is shown in FIG. 1. A reaction chamber 12 is delimited by a substantially cylindrical process tube 14 extending in a vertical direction. The lower side of the tube 14 is open and can be closed with a door plate 16. The door plate 16 supports a boat 18 that accommodates a plurality of substrates, such as wafers (not shown), in a vertically stacked manner. An exhaust 24 for process gas is preferably positioned proximate one of the vertical ends of the process tube 14. The exhaust 24 is shown at the lower end of the process tube 14. Positioned proximate the opposite vertical end of the process tube 14 is a gas entrance 23. After entering from the gas entrance 23, gases flow in a downward direction through the chamber 12 to the exhaust 24, through which they exit the chamber 12. Introduction of gases into the reaction chamber 12 is preferably microprocessor or computer controlled.

In preferred embodiments, gases entering the chamber 12 have molecular weights or densities that progress in particular ways, as discussed below, to minimize the undesired persistence or flow of gases. For example, when the reaction chamber 12 is filled with a first gas, e.g., a purge gas, having a first density, and the first gas is to be replaced by a second gas, e.g., a process gas having a second density, it has been found that the replacement proceeds more efficiently when the second density is lower than the first density. Using such as arrangement, the lighter process gas has a tendency to float on the heavier purge gas, forming a relatively stable interface region. By feeding more process gas into the reaction chamber 12, the purge gas is slowly pushed downwardly to the exhaust 24 and an efficient replacement of the purge gas ambient occurs. Similarly, at the end of a process step using the process gas, the process gas is preferably replaced by another gas, which is preferably a second purge gas. This second purge gas preferably has a third density which is lower than the density of the process gas. As a result, the lighter second purge gas has a tendency to float on the heavier process gas, forming a relatively stable interface region. By feeding more of the second purge gas into the reaction chamber, the process gas is slowly pushed downward to the exhaust and an efficient replacement of process gas ambient occurs.

A number of examples of gas sequences according to the present invention are shown in FIG. 2. These sequences are applicable to embodiments in which gas flows in a downward direction. For example, when replacing the gas in the reaction chamber 12 and for embodiments in which a gas entrance is positioned at a lower vertical level than a gas exhaust, the gas immediately preceding a process gas, the process gas and the gas immediately following a process gas in a sequence of gases entering the reaction chamber 12 preferably have a lower density or molecular weight than the previous gas.

It will be appreciated that in cases where gas flows through a reaction chamber in an upward flow direction, e.g., where the infeed of gas is at the bottom end of the reaction chamber and the exhaust is at the upper end of the chamber, the sequence of gas immediately preceding a process gas, the process gas and the gas immediately following a process gas is preferably selected with a progressively increasing density or molecular weight. Examples such a progression of gases are presented in FIG. 3. An exemplary reactor in which gas flows in an upward direction is disclosed in U.S. patent application Ser. No. 10/390,509, PROCESS TUBE SUPPORT SLEEVE WITH CIRCUMFERENTIAL CHANNELS, filed Mar. 13, 2003, the entire disclosure of which is incorporated herein by reference.

It will be appreciated that the above-described gas flows form part of one process cycle and that multiple process cycles, each having gases ordered as described herein, can be performed to process a large number of semiconductor substrates. For example, a process cycle preferably starts with loading a plurality of wafers into the reaction chamber 12. The wafers are preferably accommodated on the wafer boat 18 and are loaded by lifting the boat 18 into the process tube 14 and sealing the door plate 16. Then the reaction chamber 12 is filled with the first purge gas, which is later replaced by the process gas. The process gas is then replaced by the second purge gas. The wafer boat 18 can then be removed from the reaction chamber 12 by unsealing the door plate 16 and lowering the wafer boat 18 out of the chamber 12, thereby ending that process cycle. Another process cycle can then start with the introduction of a new wafer boat 18 into the reaction chamber 12, which is filled with the first purge gas for a new process cycle.

The transition between process cycles is preferably accomplished by purging and filling the chamber 12 with the appropriate first purge gas before loading a new wafer boat 18 into the chamber 12, or by filling the chamber 12 with the first purge gas after loading the new wafer boat 18 into the chamber 12. Where purging and filling with the first purge gas occur before loading the new wafer boat 18, it will be appreciated that the purging and filling can be accomplished before or after the wafer boat from the previous process cycle is unloaded. For example, where the second or post-processing purge gas is Ar, and the first or pre-processing purge gas is $N_2$, the chamber 12 can be purged and filled with $N_2$ after the Ar gas has forced the process gas out of the chamber 12. Then the wafer boat 18 can be removed from the chamber 12. Alternatively, the wafer boat 18 can be removed from the chamber 12 first and then purged with the appropriate first purge gas before loading a new wafer boat 18. In any case, after loading a new wafer boat 18, the chamber 12 is preferably further purged with the appropriate first purge gas to ensure a uniform gas ambient in the chamber 12.

Where filling of the chamber 12 with the appropriate purge gas occurs after loading the wafer boat 18 into the chamber 12, the chamber 12 is preferably purged and filled with another purge gas (e.g., $N_2$ in cases where the first purge gas is Ar or another gas that is different from $N_2$). After the new wafer boat 18 is loaded into the chamber 12, that purge gas is replaced with the appropriate purge gas for preceding the process gas in that process cycle.

In other embodiments, substrates on the wafer boat 18 can be exposed to multiple process gases. For example, the wafer boat 18 can remain in the reaction chamber 12 after a process gas is purged and replaced with the second purge gas. A second heavier or lighter process gas, depending upon the direction of gas flow in the chamber 12 as described herein, can then be flowed into the chamber 12 to react with the substrates. In addition, the second purge gas can also be replaced with another purge gas, as described above, which is appropriate for the molecular weight of the second process gas.

It has been found that undesired gravity or buoyancy induced convective flow patterns are particularly pronounced and problematic during processing at about atmospheric pressure. Consequently, while the methods and apparatuses disclosed herein can be applied to processing at other pressures, they are particularly advantageously applied to processing performed at about atmospheric pressure to minimize these flow patterns and to improve the uniformity of process results.

With reference now to FIG. 4, the molecular weights or atomic weights of exemplary process and purge gases are given. It will be appreciated that process and purge gases other than those illustrated in FIGS. 2 and 3 can be used. As can be seen in FIG. 4, other possible light gases include, without limitation, $NH_3$ and $CH_4$ and alternative heavy gases include, without limitation, $N_2O$, $CO_2$ and freons such as $CCl_4$. Thus, for example, where the process gas is $O_2$ and gas flows downward through a reaction chamber, the first purge gas can be $N_2O$, $CO_2$, $CCl_4$, Ar, or a mixture of at least 33⅓% Ar in $N_2$ (i.e., Ar is 33⅓% of the total volume or number of molecules in a mixture otherwise containing $N_2$) and the second purge gas can be $N_2$, He, Ne, $H_2$, $CH_4$, or $NH_3$. In another example, where the process gas is $H_2O$, and gas flows downward through a reaction chamber, the first purge gas can be $N_2O$, $CO_2$, $CCl_4$, Ar, or $N_2$ and the second purge gas can be He, Ne, $H_2$, $CH_4$, or $NH_3$. It will also be appreciated that, depending on the circumstances and the process temperatures used, non-reactive gases or process gases other than those listed may also be used. However, for reasons of convenience, non- or low-reactivity with substrates, and ease of availability, it may be preferable to use the listed inert gases (e.g., noble gases, $N_2$ and $CO_2$, depending on reactor conditions such as temperature), especially as purge gases.

In addition, with reference to FIGS. 2-4, each of the purge and process gases introduced into a reaction chamber can be a pure gas, i.e., consisting of a single gas species, or can be a mixture of gases. In addition, sequences of purge and/or process gases comprising pure gases and mixtures of gases can also be used. Where a gas is a mixture of gases, the above-discussed molecular weight and density relationship is preferably maintained, e.g., by reference to the weighted average molecular weights of the gas mixtures. The weight assigned to the molecular weight of a gas is the percentage of the mixture made up by molecules of that gas, which is equal to the volume percentages of each gas in the mixture.

In cases where gas is intended to flow in a downward direction, the weighted average molecular weight of a pure gas or a gas mixture following another gas is preferably less than the molecular weight or weighted average molecular weights of the preceding pure gas or mixture, so that the earlier pure gas or gas mixture tends to flow downwards, due to gravity or buoyancy effects, after introduction of the later mixture. For example, a mixture of 50% $N_2$/50% Ar has an weighted average molecular weight of $(28*0.5)+(40*0.5)=34$, allowing it to be used in a downflow reaction chamber as a purge gas before using $O_2$, which has a molecular weight of 32, as a process gas. Advantageously, by using a mixture of Ar and $N_2$, the usage of the more expensive Ar gas is reduced.

It will be appreciated that in cases where the direction of gas flow is upward, the weighted average molecular weight of a pure gas or a gas mixture following another gas is preferably greater than the molecular weight or weighted average molecular weights of the preceding gas. As noted above, the purge gases can also have a density or weighted average molecular weight that is about equal to that of the process gas.

In other embodiments, gravitation or buoyancy-induced flow patterns are minimized by minimizing the difference in molecular weight between newly-introduced gas and gas already present in a reaction chamber. For example, a mixture of about 33⅓% Ar in $N_2$ has a weighted average molecular weight of $(28*⅔)+(40*⅓)=32$. Such a mixture can be used as purge gas before and after using $O_2$ as a process gas since its molecular weight is about equal to the molecular weight of $O_2$ and, thus, there is minimal risk of gravitation induced gas flow patterns.

A similar situation can be approximated by actively mixing new gases with gases already present in the chamber. Preferably, the new gas (e.g., a purge gas) is mixed with the gas that is already in the chamber (e.g., a process gas) before introducing the new gas into the chamber. For example, some process gas can be withdrawn form the chamber, mixed with the new gas, and the mixture can be flowed into the chamber. Alternatively, the mixing can occur soon after entering the chamber, away from the reaction region occupied by substrates. The mixing of the gases decreases the difference between the average molecular weight of the gas (the mixture of old and new gases) entering the chamber and the gas already present in the chamber. As a result, the tendency of the newly introduced gas to develop a gravitation induced flow pattern through the earlier gas is minimized. Mixing can be accomplished by, for example, a mixing device provided inside the reaction chamber 12 (FIG. 1). The device can be positioned proximate the gas entrance 23 to mix fresh gas that is entering the reaction region of the reaction chamber 12 with the gas that is already present in the chamber 12. It will be appreciated that preferably only a small fraction of the gas already present in the chamber 12 is mixed with the new gas. Thus, the newly introduced gas mixture preferably forms a stable interface with the unmixed gas which was already present in the chamber.

Various mixing devices known in the art are suitable. For example, the mixing device can be a static mixer disposed inside the reaction chamber 12. Another exemplary mixing device is a venturi device having an inlet connected to a gas feed and a suction opening and a discharge opening in communication with the reaction chamber 12. Gas from the gas feed is mixed inside the venturi device with gas already present in the reaction chamber before the gas from the gas feed is discharged into the reaction region of the reaction chamber. The mixing devices, such as the static mixer or the venturi device, can be made of quartz, for high heat resistance, allowing the mixer to be integrated with the process tube. For the venturi device, a suction flow of a few times the feed flow can be achieved and is possible with channel diameters in the order of about 1 to a few mm.

It will be appreciated that, over time, the relative amount of gas (e.g., process gas) originally in the chamber 12 decreases as more of the newly introduced gas (e.g., process gas) is flowed into the chamber 12. It will also be appreciated that constituent gases of a well mixed gas mixture preferably do not separate out under typical processing conditions and time frames.

In other embodiments, another approach for minimizing gravitation or buoyancy-induced flow patterns by using gases with similar molecular weights is to gradually change from a first gas to a second gas, rather than abruptly changing from flowing the first gas to flowing the second gas. For example, the second gas can be mixed with the first gas, with the quantity of the second gas in the mix increasing over time in small steps.

When introducing a gas into a reaction chamber, the earlier gas can tolerate to a small difference in gas density in the "reverse" direction before instabilities occur; that is, minimal instability at the interface of the gases can be achieved if the difference in gas density is small. When gas travels downward to exit a chamber, a "reversed" direction situation occurs when a higher molecular weight gas is introduced above a lower molecular weight gas. The gases are "reversed" in that the molecular weights of the gases are the opposite of the preferred arrangement discussed above. Thus, for cases in which gas travels upward to exit a chamber, the "reversed" situation occurs when gas entering the chamber has a lower molecular weight than the earlier gas in the chamber.

When the difference in weighted average molecular weight of each gas in the reverse direction remains smaller than about 1.6, more preferably, smaller than about 0.8, and most preferably smaller than about 0.4, the flow of the earlier and later introduced gases through the chamber remains stable. Thus, where gas travels downward to exit a chamber, an earlier gas can advantageously be replaced by a later gas with a higher molecular weight; and where gas travels upward to exit a chamber, an earlier gas can advantageously be replaced by a later gas with a lower molecular weight.

For example, in the case of $N_2$, having a molecular weight of 28, and $O_2$, having a molecular weight of 32, the difference in molecular weight is 4. When changing from $N_2$ to $O_2$, or vice versa, results in a reversed density situation (e.g., where $O_2$ is introduced after $N_2$ where the gas inlet 23 is at a higher level than the exhaust 24, or where $N_2$ is introduced after $O_2$ where the gas inlet 23 is at a lower level than the exhaust 24), the change in gas composition is preferably made in steps of about 40% or less of the molecular weight difference (i.e., 40% of 4), with each step resulting in a change in the weighted average molecular weight of about 1.6 for the entering gas mixture of $N_2$ and $O_2$. More preferably, the change is made in steps of about 20%, with each step resulting in a change in the weighted average molecular weight of about 0.8 for $N_2$ and $O_2$. Most preferably, the change is made in steps of about 10%, in which each step results in a change in weighted average molecular weight of about 0.4 $N_2$ and $O_2$.

Preferably, the steps should be long enough so that the entire volume of the reaction chamber is replaced at least once so that gas of one average molecular weight completely occupies the chamber. Under typical conditions, the volume of the reaction chamber is replaced about once or twice a minute. Therefore, each step preferably has a duration of about 30 seconds or longer or, more preferably, about one minute or longer. Because older volumes of gas are typically pushed out by newer volumes of in this time, the duration needed to replace the volume of gas inside the chamber is typically also the residence time of the gas. The upper limit on the replacement duration can vary and is typically dependent on process considerations such as desired throughput. Preferably, the replacement duration is about 5 minutes or less and, more preferably, about 2 minutes or less. Thus, it will be appreciated that the weighted average molecular weights of the gases vary by a set variation amount per unit of time, e.g., the weighted average molecular weights of the gases vary by the desired difference in weighted average molecular weights for each duration of time needed to substantially completely replace the atmosphere in a chamber. For example, the variation rate can be, e.g., about 1.6 or less, more preferably, about 0.8 or less, and, most preferably, about 0.4 or less per for each duration. The duration is preferably about 30 seconds or longer and, so, the weighted average molecular weights of the gases can change by, e.g., about 1.6 or less every 30 seconds.

In other embodiments, the unit of time can be smaller, e.g., about one minute or less, or about 30 seconds or less. In such cases, the variation amount is preferably also small. Thus, the variation rate can be, e.g., about 1.6 or less per minute or less, more preferably, about 0.8 or less per minute or less, and, most preferably, about 0.4 or less per minute or less.

As noted above, instead of a abrupt change in gas composition, a gradual change can be applied, e.g., by slowly ramping down the initial gas and ramping up the newly introduced gas, so that both gases are mixed in the piping system and simultaneously flowed into the chamber for a time. In that case, the rate of change of the composition of the gas flow introduced into the tube is preferably such that the rate of change of the weighted average molecular weight is about 1.6 or less per minute, more preferably about 0.8 or less per minute and most preferably about 0.4 or less per minute. In the example above, in the case of a change from $N_2$ to $O_2$, in a reversed density build-up situation, a complete change from 100% $O_2$ to 100% $N_2$ takes about 2.5 minutes or more, more preferably about 5 minutes or more, most preferably about 10 minutes or more. Longer times are preferred to allow a more gradual change in molecular weights, so as to avoid flow pattern instabilities.

For other combinations of gases, e.g., $N_2$ and $H_2O$, having molecular weights of respectively of 28 and 18, the same values for differences in molecular weight or rate of change of weighted average molecular weight preferably apply. Correspondingly, a stepwise change of 0.8 in molecular weight means, in the case of $N_2$ and $H_2O$, a change in composition of 8% or less and a rate of change in weighted average molecular weight of 1.6 per minute or less means a composition change of 16% per minute or more. It will be clear that in some circumstances this results in relatively long times for changing gas atmospheres and, as such, for some combinations of gases, it is preferred to avoid a situation wherein a reversed density profile in the reaction chamber develops.

It will be appreciated that while all gases are preferably introduced from the same end of the reaction chamber so that they flow in the same direction to the opposite end of the chamber, the first purge gas need not be introduced from the same end of the reaction chamber as the other gases. For example, the first purge gas can be flowed into the reaction chamber from any location, so long as the molecular weight or density of the gas already inside the chamber is more (in cases of downward flow) or less (in cases of upward flow) than the molecular weight or density of the purge gas.

In addition, the gas inlets and gas exhausts for the introduction and exhaust of gases can vary. For example, one set of first purge gas, process gas and second purge gas can be flowed downward through an inlet near the top of a reaction chamber and exhausted at an exhaust near the bottom of the chamber, while another set of first purge gas, process gas and second purge gas can be flowed upward through an inlet near the bottom of the chamber and exhausted at an exhaust near the top of the chamber. Such an arrangement of gas inlets and exhausts would allow the preferred sequence of gases of increasing or decreasing molecular weights to be maintained without causing a reverse density situation. Moreover, it is not necessary to replace the purge gas present in the chamber with the appropriate purge gas to start another sequence in which purge, process and purge gases are successively flowed into the chamber. Advantageously, such an arrangement of alternating downward and upward gas flow directions could increase throughput by eliminating an unnecessary purge step, especially in cases where a substrate is exposed to process gas multiple times with purge steps in between the process gas exposures.

For example, where gas flows downward to exit a chamber, a heavy purge gas can be followed by a lighter process gas, which is followed by a purge gas that is the lightest of the three gases. The lightest purge gas can be maintained in the chamber, which is then arranged to allow gas to exit by flowing upwards. A second process gas, which is not as light as the lightest purge gas and which can be the same or a different gas from the process gas previously flowed into the chamber, is then flowed into the chamber in an upward direction. The heavy purge gas can then be introduced to purge the process gas from the chamber. Advantageously, because the chamber allows the direction of the gas flow to be changed as desired, the chamber atmosphere need not be purged of the lightest purge gas and replaced with the heavier purge gas before introduction of the second process gas.

Moreover, while illustrated with a single purge gas flowing in a single step both before and after a single process gas step, it will be appreciated that multiple purge steps before and/or after the process gas step or multiple sequential process gas introductions are also possible for each wafer batch or process cycle. Preferably, the molecular weight and density relationships between successive gases are maintained as discussed above for each gas change in which at least one of the gases is a process gas.

Accordingly, it will be appreciated by those skilled in the art that other various omissions, additions and modifications can be made to the processes described above without departing from the scope of the invention. All such modifications and changes are intended to fall within the scope of the invention, as defined by the appended claims.

We claim:

1. A method for semiconductor processing, comprising:
providing a substrate in a reaction chamber;
flowing a first gas into the chamber;
flowing a second gas into the chamber after flowing the first gas; and
flowing a third gas into the chamber after flowing the second gas,
wherein the first, second and third gases flow vertically to exit the chamber After entering the chamber, and wherein the first, second and third gases have weighted average molecular weights or densities which bias gases flowed earlier into the reaction chamber to exit the reaction chamber, by force of gravity or buoyancy, before later injected gases.

2. The method of claim 1, wherein the first, second and third gases flow downwardly to exit the chamber after entering the chamber and wherein the weighted average molecular weights or densities of the first, second and third gases decrease with injection of each successive gas.

3. The method of claim 2, wherein the first and third gases are purge gases.

4. The method of claim 3, wherein the first and third gases are non-reactive with the substrate.

5. The method of claim 2, wherein the first gas is a gas mixture comprising an inert gas.

6. The method of claim 5, wherein the inert gas is argon.

7. The method of claim 5, wherein the second gas comprises an oxidant.

8. The method of claim 7, wherein the oxidant is $H_2O$.

9. The method of claim 7, wherein the third gas comprises hydrogen gas.

10. The method of claim 1, wherein one or more of the first, second and third gases are mixtures of pure gases.

11. The method of claim 1, wherein the first, second and third gases flow upwardly to exit the chamber after entering the chamber and wherein the weighted average molecular weights or densities of the first, second and third gases increase with injection of each successive gas.

12. The method of claim 1, wherein flowing the second gas substantially replaces the first gas in the chamber with the second gas, wherein flowing the third gas substantially replaces the second gas in the chamber with the third gas.

13. A method for semiconductor processing, comprising:
providing a semiconductor substrate in a vertically extending reaction chamber; and
sequentially exposing the semiconductor substrate to each of three or more gases, each gas having a molecular weight,
wherein, if the three or more gases travel upwardly to exit the chamber, the three or more gases contacting the substrate during sequentially exposing have an about equal or an increasing molecular weight as sequentially exposing progresses or, if the three or more gases travel downwardly to exit the chamber, the three or more gases contacting the substrate during sequentially exposing have an about equal or a decreasing molecular weight as sequentially exposing progresses.

14. The method of claim 13, wherein one or more of the three or more gases comprise mixtures of pure gases and the molecular weight of the mixtures of pure gases is a weighted average molecular weight of the pure gases constituting the mixture.

15. The method of claim 14, wherein a first of the three or more gases in a sequence for sequentially exposing comprises one or more gases selected from the group consisting of $N_2O$, $CO_2$, $CCl_4$, Ar, $N_2$ and mixtures thereof.

16. The method of claim 15, wherein a second of the three or more gases in the sequence for sequentially exposing comprises an oxygen-containing gas.

17. The method of claim 16, wherein the oxygen-containing gas comprises a gas chosen from the group consisting of $H_2O$, $O_2$ and combinations thereof.

18. The method of claim 16, wherein a third gas of the three or more gases in the sequence for sequentially exposing comprises one or more gases selected from the group consisting of $N_2$, He, Ne, $H_2$, $CH_4$, $NH_3$, and mixtures thereof.

19. The method of claim 18, wherein the reaction chamber is disposed within a vertical furnace and wherein the three or more gases are injected into the reaction chamber proximate a top of the reaction chamber and are exhausted from the reaction chamber proximate a bottom of the reaction chamber and wherein each successive one of the three or more gases have an increasingly lower molecular weight as sequentially exposing progresses.

20. The method of claim 19, further comprising loading the substrate into the reaction chamber and purging the reaction chamber with a gas unreactive with the substrate before loading and before sequentially exposing the semiconductor substrate to a first of the three or more gases.

21. The method of claim 13, further comprising purging the reaction chamber with a gas unreactive with the substrate before sequentially exposing the semiconductor substrate to a first of the three or more gases.

22. The method of claim 13, further comprising loading the substrate into the reaction chamber and purging the reaction chamber with a first of the three or more gases before and after loading the substrate.

23. The method of claim 13, further comprising purging the reaction chamber with a gas unreactive with the substrate after sequentially exposing the semiconductor substrate to the three or more gases.

24. The method of claim 23, wherein the gas unreactive with the substrate is a first of the three or more gases to contact the substrate during sequentially exposing.

25. The method of claim 13, wherein a first and a third of the three or more gases is the same gas.

* * * * *

UNITED STATES PATENT AND TRADEMARK OFFICE
CERTIFICATE OF CORRECTION

Page 1 of 1

PATENT NO. : 7,749,918 B2
APPLICATION NO. : 11/843530
DATED : July 6, 2010
INVENTOR(S) : Oosterlaken et al.

It is certified that error appears in the above-identified patent and that said Letters Patent is hereby corrected as shown below:

On sheet 3 of 3 (Figure 4), line 13 (approximately), please change "N2" to --$N_2$--.

In Col. 7, line 11, please change "(28* 0.5)" to --(28*0.5)--.

In Col. 7, line 38, please change "form" to --from--.

In Col. 10, line 59 (approximately), in Claim 1, please change "After" to --after--.

Signed and Sealed this
Twenty-fifth Day of January, 2011

David J. Kappos
*Director of the United States Patent and Trademark Office*